United States Patent [19]
Lin et al.

[11] Patent Number: 5,830,533
[45] Date of Patent: Nov. 3, 1998

[54] SELECTIVE PATTERNING OF METALLIZATION ON A DIELECTRIC SUBSTRATE

[75] Inventors: Charles W. C. Lin, San Antonio; Randy L. German, Austin, both of Tex.

[73] Assignee: Microelectronics and Computer Technology Corporation, Austin, Tex.

[21] Appl. No.: 985,663

[22] Filed: Dec. 4, 1992

Related U.S. Application Data

[63] Continuation of Ser. No. 706,467, May 28, 1991, abandoned.

[51] Int. Cl.⁶ ...................................................... B05D 1/32
[52] U.S. Cl. .......................... 427/272; 427/437; 427/438; 427/304; 427/305; 427/307; 427/250; 427/124; 427/96; 427/98; 427/125; 204/192.15
[58] Field of Search ..................................... 427/250, 437, 427/438, 304, 305, 307, 124, 125, 96, 98, 272; 156/643, 650, 652, 654, 637, 655, 656; 204/192.15

[56] References Cited

U.S. PATENT DOCUMENTS

| | | | |
|---|---|---|---|
| 3,664,899 | 5/1972 | Wright et al. | 427/272 |
| 4,193,849 | 3/1980 | Sato | 204/15 |
| 4,388,351 | 6/1983 | Sawyer | 427/304 |
| 4,451,554 | 5/1984 | Kishi et al. | 427/96 |
| 4,582,564 | 4/1986 | Shanefield | 427/98 |
| 4,701,351 | 10/1987 | Jackson | 427/98 |
| 4,869,930 | 9/1989 | Clarke | 427/252 |
| 4,981,715 | 1/1991 | Hirsch et al. | 427/53.1 |

OTHER PUBLICATIONS

Vossen et al, "Thin Film Processes", Academic Press, New York, 1978 pp. 315–317.

*Primary Examiner*—Roy V. King
*Attorney, Agent, or Firm*—Skjerven, Morrill, MacPherson, Franklin & Friel LLP; David M. Sigmond

[57] ABSTRACT

A method of selectively fabricating metallization on a dielectric substrate is disclosed. A seed layer is sputtered on a polymer dielectric, a patterned photoresist mask is disposed over the seed layer, exposed portions of the seed layer are etched, the photoresist is stripped, and copper is deposited without a mask by electroless plating on the unetched seed layer to form well-adhering high density copper lines without exposing the photoresist to the electroless bath.

27 Claims, 3 Drawing Sheets

5,830,533

SELECTIVE PATTERNING OF METALLIZATION ON A DIELECTRIC SUBSTRATE

CROSS-REFERENCE TO RELATED APPLICATIONS

This is a continuation of U.S. Ser. No. 07/706,467 filed May 28, 1991, now abandoned.

BACKGROUND OF THE INVENTION

Current multi-chip circuitry design requires the attachment of numerous integrated circuit chips to high density electrical interconnects, also known as multi-chip-modules (MCM). The electrical interconnects normally include surface pads for bonding to the chips and buried electrical lines which interconnect selected pads, thereby providing electrical connections or routing for the chips mounted thereon.

Numerous prior art techniques are directed to the fabrication of multilayer electrical interconnect substrates. Techniques include electroplating with positive working photoresist (in which the resist exposed during photolithography is removed) or negative working photoresist (in which non-exposed resist is removed), electroless plating with negative working photoresist, a subtractive approach, and direct writing techniques. Drawbacks which may arise include 1) non-uniformity of electrolytically deposited metal; 2) negative resist reliability problems for films with high aspect ratios; 3) undercut and inconsistent etching rate problems found with the subtractive removal of materials; and 4) numerous process steps necessary for lift-off approaches.

Fabricating electrical interconnects by electrolessly deposited copper is considered particularly desirable since it tends to increase yields, throughput and uniformity while lowering manufacturing costs. In photoresist masking processes, electroless copper typically requires a negative photoresist mask due to the rapid deformation of positive photoresists in high PH (above 10) solutions such as etchant baths and electroless baths. However, negative photoresist is currently difficult to process for films thicker than 5 microns, fails to yield sufficient line definition (over 300 lines per inch) for high density substrates, and sometimes requires known carcinogens for developing. Furthermore, the aspect ratio of negative resists has conventionally been limited to approximately 0.3, although a recently developed experimental negative working resist may be capable of aspect ratios as high as 2.

An example of an electroless copper process which requires metal deposition through a mask is disclosed in U.S. Pat. No. 4,701,351 to Jackson. A substrate is coated with a thin layer of polymer which complexes with a noble metal compound, and the layer of polymer is contacted with a noble metal compound which forms a complex with the layer of polymer which eventually dries. An electroless plating bath such as copper or nickel is then applied to form metal features. Patterning is accomplished by using negative working photoresist. The photoresist can be coated over the complexed polymer and patternwise exposed and developed to define the underlying areas to be metallized, and then the substrate can be coated with a noble metal compound which binds the exposed complexing polymer through the openings in the photoresist. However, adhesion of plated metal on complexed polymer can be a serious problem, and the use of negative photoresist limits resolution.

As such, there exists a need both in high density substrate and in printed wiring board (PWB) manufacturing for fabricating metal features without electrolytic plating, such as by electroless copper deposition, without depositing metal through a negative photoresist mask.

SUMMARY

An object of the present invention is to provide a simple and reliable additive metallization process for fabricating high density multilayer electrical interconnects which uses a photoresist mask to pattern well-adhering metallization deposited on a dielectric by electroless deposition or chemical vapor deposition without exposing the photoresist to the metal deposition process.

Another object of the present invention is a method of patterning metal on a dielectric substrate without the use of electrolytic plating and without the use of photoresist during metal deposition.

Still a further object of the present invention is to provide a fabrication method that can be repeated layer-by-layer to build a multilayer electrical interconnect structure.

A feature of the present invention includes electrolessly depositing, sputtering or evaporating on a dielectric a seed layer of metal or a wet chemical conductive film such as polymer or powder, overlaying a resist mask on the seed layer, etching the exposed seed layer by a dry etch or a wet chemical etch, stripping the mask, and depositing an electrically conductive metal on the unetched seed layer by electroless deposition or chemical vapor deposition.

Another feature is a method for electroless deposition of copper on a patterned seed layer on a polymer substrate without exposing a positive working photoresist mask to an electroless bath which yields well adhering 5 micron thick copper lines with high resolution (at least 300 lines per inch).

An additional feature is the use of a seed layer for adhesion between an underlaying dielectric and an overlaying metal deposited thereon.

Advantages of the present invention include the elimination of low resolution typically found with negative working resist, the elimination of photoresist deformation using electroless or electrolytic deposition, uniformity of metal features, high throughput, and superior pattern shape control as compared to typical subtractive processes.

These and other objects, features and advantages of the present invention will be more readily apparent from a review of the detailed description and preferred embodiments which follow.

DETAILED DESCRIPTION OF THE PREFERRED EMBODIMENTS

Figure 1:
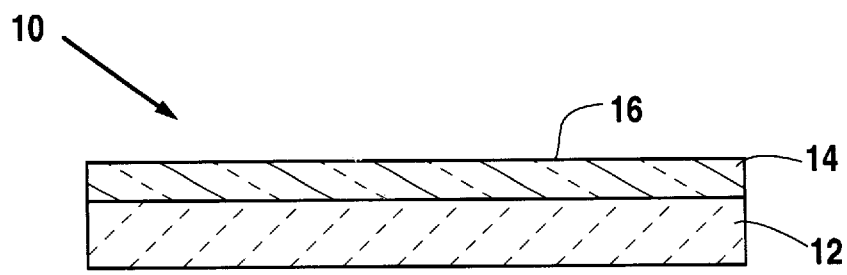
FIGS. 1–10 are fragmentary elevational views in cross-section illustrating successive manufacturing stages of a multilayer electrical interconnect in accordance with the present invention.

Referring now to the drawings and particularly to FIG. 1, the reference numeral 10 generally indicates any suitable electrical interconnect substrate. Substrate 10 includes a ceramic base 12 covered with a dielectric such as 20 microns of polymer 14 having a smooth top surface 16.

Figure 2:
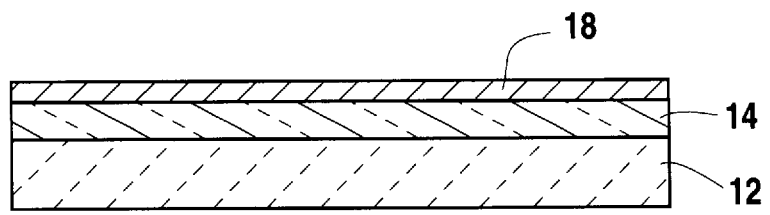

Referring now to FIG. 2, a thin film of seeding and adhesion layer 18 deposited on surface 16. The purpose of the seed layer deposition is to deposit a thin, conductive layer (or multi-layer sandwich) of film to act as an electroless plating initiator (or a chemical vapor deposition initiator if such deposition shall be used) as well as an adhesive layer. The seed layer 18 must have good adhesion to the underlying dielectric 14 as well as to the metal to be deposited thereon, be easily etched and removed after the photoresist step, and remain unoxidized or be easily cleaned prior to the metallization step. Additionally, the seeding layer must be stable up to the processing temperature of the associated dielectric, the potential high temperature exposure during component attachment to the substrate, and the hermetic sealing of the substrate.

Suitable metals for seed layer 18 include chromium, aluminum, ceranium, gold, copper, nickel, platinum, tungsten and titanium; suitable non-metals include conducting polymers and conducting powders. Seed layer 18 can be deposited by conventional techniques including electroless plating, sputtering and evaporating. Chromium and titanium are preferred for sputtering; aluminum for evaporating. Several metals including titanium, chromium, and nickel are known to have good adhesion to most plastics and polymers. Furthermore, copper is known to be a good initiator for electroless copper plating and for chemical vapor deposition of copper. Titanium/copper/titanium and chromium/copper/chromium have been investigated. Applicant has found that chromium/copper/titanium is the preferred combination. Adhesion is probably the most important single problem associated with forming metal/polymer interfaces. Adhesive forces at these interfaces can be related to surface and near-surface chemical reactions and to intermixing across those boundaries. Of many techniques, the modification of polymer surfaces by evaporated or sputtered metals has been shown to receive good adhesion between metal and polymer. See J. Burkstrand, "Metal-polymer interfaces: Adhesion and x-ray photoemission studies," *Journal of Applied Physics*, Vol. 52(7), (1981), pp.4795–4800; and J. Burkstrand, "Summary Abstract: Chemical interactions at polymer-metal interfaces and the correlation with adhesion," *Journal of Vacuum Science Technology*, Vol. 20(3), (1982), pp. 440–441.

Returning to the example, seed layer 18 consists of a sputter deposited trilayer (shown as one layer) of titanium/copper/chromium with a 2500 angstrom thick copper layer sandwiched between 500 angstrom thick layers of titanium and chromium. The bottom chromium layer is used as an adhesion pre-plate for the copper. The top titanium layer is used for adhesion to an overlaying positive working resist layer as well as a protective coat to prevent the copper from oxidizing prior to depositing a metal thereon. Any titanium over the copper must be removed, however, prior to electrolessly depositing metal on the copper seed.

Figure 3:
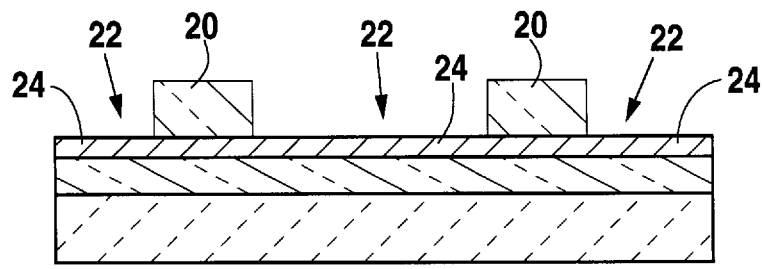

With reference now to FIG. 3, an 8 micron thick positive working photoresist mask 20 is overlayed on seed layer 18; although photoresist masks as thin as 0.1 microns are acceptable. Commercially available electroless baths have a high enough PH (e.g. 10–12) to dissolve typical positive working resists, however, as will be seen, mask 20 shall not be exposed to the subsequent electroless bath. Photoresist 20 is next patterned through standard lithographic methods to form a predetermined pattern with 15 micron wide openings 22 above and exposing portions 24 of seed layer 18.

Figure 4:
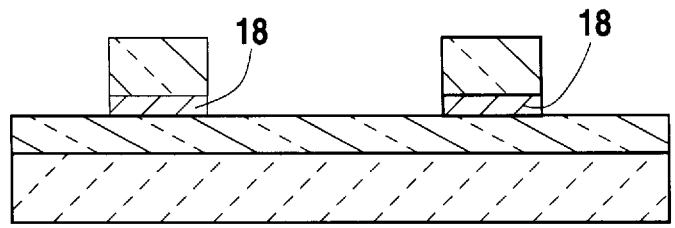

Referring now to FIG. 4, the exposed portions 24 of seed layer 18 are etched and removed. Any suitable dry or wet chemical etch can be used.

Figure 5:
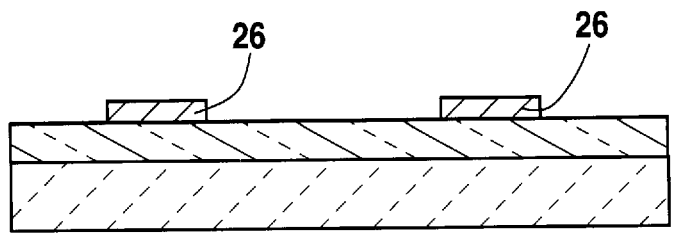

With reference now to FIG. 5, photoresist 20 is now stripped and removed from substrate 10, thereby exposing the unetched portions 26 of seed layer 18. In addition, any titanium covering unetched portions 26 is also etched to expose the copper. The unetched portions 26 must correspond to the predetermined pattern of mask 20.

Figure 6:
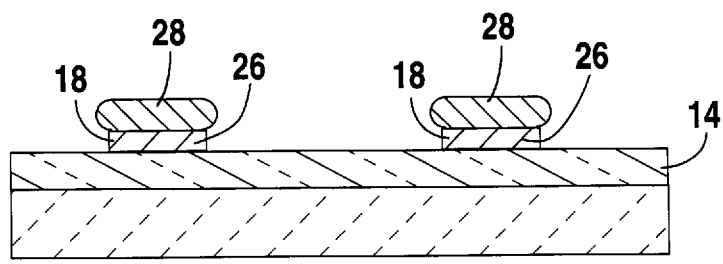

Referring now to FIG. 6, electrically conductive metal 28 is deposited on unetched seed layer portions 26 without electrolytic deposition and without using a mask. Preferably, metal 28 is deposited by either electroless deposition or chemical vapor deposition. For instance, metal 28 can be deposited by electroless deposition, wherein the preferred metals are copper, nickel, gold, silver, palladium and platinum. Alternatively, metal 28 can be deposited by chemical vapor deposition, in which case the preferred metals are tungsten, aluminum, and copper. Electrolytic deposition is not possible since the metal features are isolated. In the event seed layer 18 is a metal, usually it is preferable to deposit the same metal 28 thereon. Thus, in the present example, 5 micron thick copper lines 28 are electrolessly deposited on copper seeds 18. As deposition occurs seed layer 18 provides a seed for metal 28. That is, seed layer 18 is an initiator for (or autocatalytic to) metal 28, whereby metal 28 spontaneously deposits on the seed layer. Conversely, polymer 14 is a non-initiator (non-autocatalytic) for metal 28 and thus no metal 28 deposits on polymer 14. After deposition of metal 28, seed layer 18 provides adhesion between metal 28 and the underlying dielectric 14. The deposited metal 28 forms electrically conductive lines in a pattern corresponding to the predetermined pattern in photoresist mask 20 and seed layer 18. The lines in this pattern may exhibit a line density of over 300 lines per inch, as is often necessary for high density packaging/interconnection applications.

Figure 7:
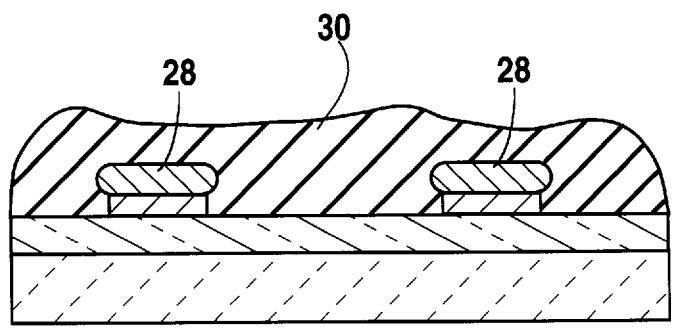
Figure 8:
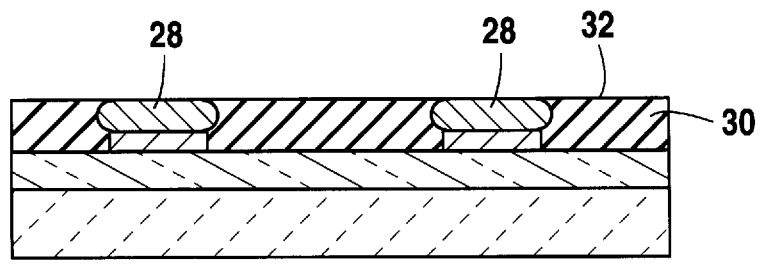
Figure 9:
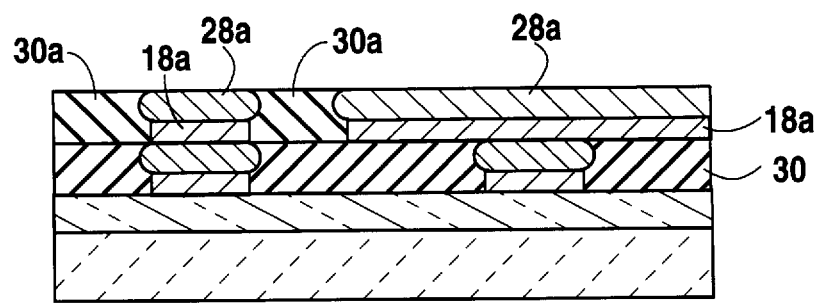
Figure 10:
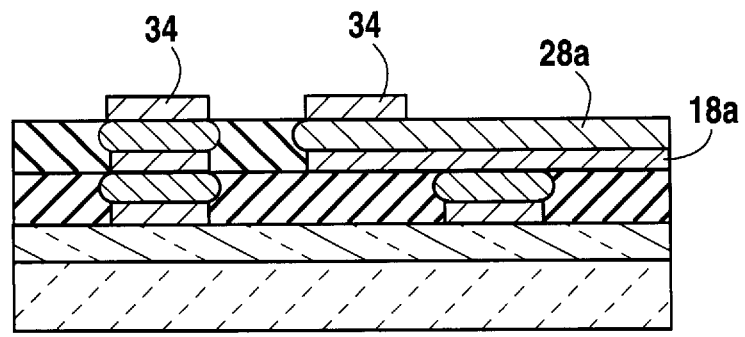

As best seen in FIGS. 7–10, the process steps of FIGS. 1–6 can be repeated, if desired, to form a multilayer electrical interconnect. In FIG. 7 a layer of polymer 30 is spin coated over substrate 10, and in FIG. 8 polymer top surface 32 is planarized by mechanical polishing to form a smooth surface coplanar with the exposed tops of electrical conductors 28. In FIG. 9 a second layer of seeding material 18a and electrical conductors 28a are fabricated as previously described and coated with another layer of polymer 30a. Conductors 28 can form x-lines and conductors 28a can form y-lines orthogonal to the x-lines. In FIG. 10 bonding pads 34 having 4 mil center-to-center spacing are formed for connection to surface mounted integrated circuits, such as by tape-automated-bonding (TAB) outer leads. The conductors and pads of substrate 10 can be patterned to form a customizable multilayer electrical interconnect such as disclosed in European Patent Convention Application No. 88308996.3 by Carey.

Alternatively, if desired, in another embodiment of the present invention, a seed layer 18' (not shown) can be used which is not initially an initiator for a metal 28. After the resist 20 is stripped, but before depositing metal 28, seed layer 18' can be immersion coated with an activating material which does not deposit on the dielectric. Thereafter, substrate 10 can be dipped in an electroless plating bath containing metal 28 to plate metal lines on seed layer 18' corresponding to the predetermined pattern of the resist. By way of example a chromium seed layer can be patterned and then coated with palladium (without depositing palladium on a polymer dielectric) to become autocatalytic in an electroless copper bath.

The present invention is therefore well adapted to carry out the objects and attain the ends and advantages mentioned, as well as others inherent therein. While presently preferred embodiments of the invention have been described for the purpose of disclosure, numerous changes in the details of construction and arrangement of parts may be made without departing from the spirit of the present invention and the scope of the appended claims.

What is claimed is:

1. A method of selectively patterning metal on a dielectric substrate, comprising the following steps in the sequence set forth:

depositing a seed layer on a dielectric substrate wherein the seed layer is autocatalytic to an electrically conductive metal whereas the dielectric substrate is non-autocatalytic to the metal;

overlaying a resist mask on the seed layer wherein the resist mask has a pattern which covers portions of the seed layer whereas a plurality of openings in the resist mask expose other portions of the seed layer;

etching the exposed portions of the seed layer;

removing the resist mask thereby exposing the unetched portions of the seed layer which correspond to the pattern of the resist mask; and depositing the metal on the unetched portions of the seed layer without depositing the metal on the dielectric substrate and without using a mask wherein the deposited metal corresponds to the pattern and the seed layer provides adhesion between the dielectric substrate and the deposited metal.

2. The method of claim 1 wherein the electrically conductive metal is deposited by electroless deposition and is selected from the group consisting of copper, nickel, gold, silver, palladium and platinum.

3. The method of claim 1 wherein the electrically conductive metal is deposited by chemical vapor deposition and is selected from the group consisting of tungsten, aluminum, and copper.

4. The method of claim 1 wherein the seed layer comprises a lower layer of titanium, chromium or aluminum.

5. The method of claim 1 wherein the seed layer is deposited by sputtering.

6. The method of claim 1 wherein the seed layer is a metal selected from the group consisting of chromium, aluminum, copper, ceranium, nickel, gold, and titanium.

7. The method of claim 1 wherein the seed layer is a conductive polymer or a conductive powder.

8. The method of claim 1 wherein the resist mask is positive working photoresist.

9. The method of claim 1 wherein the resist mask is approximately 0.1 to 8 microns thick.

10. The method of claim 1, wherein between the steps of removing the resist mask and depositing the metal, an initiator material is coated over the unetched portions of the seed layer without contacting the dielectric substrate.

11. The method of claim 1 wherein the etch is a dry etch.

12. The method of claim 1 wherein the etch is a wet chemical etch.

13. The method of claim 1 wherein the dielectric substrate is a polymer.

14. A method of selectively fabricating metallization on a polymer substrate, comprising the following steps in the sequence set forth:

depositing an adhesive seed layer on a polymer substrate wherein the seed layer is autocatalytic to an electrically conductive metal whereas the polymer substrate is non-autocatalytic to the metal;

overlaying a photoresist mask at least 0.1 microns thick on the seed layer;

forming a pattern in the photoresist mask which covers portions of the seed layer wherein a plurality of openings in the photoresist mask expose other portions of the seed layer;

etching the exposed portions of the seed layer;

removing the photoresist mask thereby exposing the unetched portions of the seed layer which correspond to the pattern of the photoresist mask; and depositing the metal on the unetched portions of the seed layer without depositing the metal on the polymer substrate and without using a mask wherein the deposited metal corresponds to the pattern and the unetched seed layer provides adhesion between the deposited metal and the polymer substrate.

15. The method of claim 14 wherein the electrically conductive metal is deposited by electroless deposition, and the electrically conductive metal is selected from the group consisting of copper, nickel, gold, silver, palladium and platinum.

16. The method of claim 14 wherein the electrically conductive metal is deposited by chemical vapor deposition, and the electrically conductive metal is selected from the group consisting of tungsten, aluminum, and copper.

17. The method of claim 14 wherein the seed layer is copper and the deposited metal is electrolessly deposited copper.

18. The method of claim 14, further comprising applying an initiator to the unetched seed layer but not the polymer substrate after removing the photoresist but before depositing the metal.

19. The method of claim 18 wherein the initiator is deposited by immersion coating and is selected from the group consisting of palladium, gold, silver, zinc, platinum, copper and nickel.

20. A method of electrolessly depositing copper in a pattern on a polymer layer, comprising the following steps in the sequence set forth:

sputtering a seed layer on a planar polymer layer, the seed layer being autocatalytic to copper and comprising an adhesive bottom layer of titanium or chromium and a copper layer over the bottom layer whereas the polymer layer is non-autocatalytic to copper;

overlaying a layer of positive working photoresist on the seed layer;

patterning the photoresist to form a pattern which covers portions of the seed layer wherein a plurality of openings in the photoresist expose other portions of the seed layer;

etching the exposed seed layer portions;

stripping the photoresist thereby exposing the unetched portions of the seed layer which correspond to the pattern of the photoresist; and electrolessly depositing copper on the unetched seed layer without depositing the copper on the polymer layer wherein the copper is at least 5 microns thick and corresponds to the pattern with a line density of at least 300 lines per inch, and the seed layer provides adhesion between the deposited copper and the polymer layer.

21. A method of selectively patterning metal on a dielectric substrate, comprising the following steps in the sequence set forth:

depositing a seed layer on a dielectric substrate wherein the seed layer and the dielectric substrate are non-autocatalytic to an electrically conductive metal;

overlaying a resist mask on the seed layer wherein the resist mask has a pattern which covers portions of the seed layer whereas a plurality of openings in the resist mask expose other portions of the seed layer;

etching the exposed portions of the seed layer;

removing the resist mask thereby exposing the unetched portions of the seed layer which correspond to the pattern of the resist mask;

rendering the unetched portions of the seed layer catalytic to the metal; and depositing the metal on the unetched portions of the seed layer without depositing the metal on the dielectric substrate and without using a mask wherein the deposited metal corresponds to the pattern and the seed layer provides adhesion between the dielectric substrate and the deposited metal.

22. The method of claim 21 wherein the unetched portions of the seed layer are rendered catalytic to the metal by coating the unetched portions of the seed layer with an initiator material.

23. The method of claim 22 wherein the initiator material is coated over the unetched portions of the seed layer without being deposited on the dielectric substrate.

24. The method of claim 23 wherein the initiator material is coated by immersion coating.

25. The method of claims 21 or 24 wherein the electrically conductive metal is deposited by electroless deposition.

26. The method of claim 25 wherein the resist mask is a positive working photoresist.

27. The method of claim 25 wherein the electrically conductive metal is copper and the initiator material is palladium.

* * * * *